US008108762B2

(12) United States Patent
Liu et al.

(10) Patent No.: US 8,108,762 B2
(45) Date of Patent: Jan. 31, 2012

(54) OPERATING METHOD AND CIRCUIT FOR LOW DENSITY PARITY CHECK (LDPC) DECODER

(75) Inventors: Chih-Hao Liu, Sindian (TW); Yen-Chin Liao, Taipei (TW); Chen-Yi Lee, Hsinchu (TW); Hsie-Chia Chang, Keelung (TW); Yarsun Hsu, Jhonghe (TW)

(73) Assignee: National Chiao Tung University, Hsinchu (TW)

( * ) Notice: Subject to any disclaimer, the term of this patent is extended or adjusted under 35 U.S.C. 154(b) by 1113 days.

(21) Appl. No.: 11/939,119

(22) Filed: Nov. 13, 2007

(65) Prior Publication Data

US 2009/0037799 A1 Feb. 5, 2009

(30) Foreign Application Priority Data

Jul. 31, 2007 (TW) .................................. 96128039

(51) Int. Cl.
*G06F 11/00* (2006.01)
*H03M 13/00* (2006.01)
(52) U.S. Cl. ........................ 714/801; 714/758
(58) Field of Classification Search .................. 714/758, 714/800, 801
See application file for complete search history.

(56) References Cited

U.S. PATENT DOCUMENTS

| 6,938,196 B2 | 8/2005 | Richardson et al. |
| 6,957,375 B2 | 10/2005 | Richardson et al. |
| 7,313,752 B2 * | 12/2007 | Kyung et al. ............... 714/801 |
| 7,395,487 B2 * | 7/2008 | Tran et al. ................. 714/758 |
| 7,454,685 B2 * | 11/2008 | Kim et al. .................. 714/758 |

OTHER PUBLICATIONS

M.M. Mansour and N.R. Shanbhag, "A 640-Mb/s 2048-Bit Programmable LDPC Decoder Chip", IEEE Journal of Solid-State Circuits, vol. 41, No. 3, Mar. 2006.
Jun Tang, B.T. Sundaramurthy V. and Keshab K. Parhi, "Reconfigurable Shuffle Network Design in LDPC Decoders", Application-specific Systems, Architecture and Processor, 2006 (ASAP '06), Steamboat Springs, CO, pp. 81-86, Sep. 2006.
Se-Hyeon Kang and In-Cheol Park, "Loosely Coupled Memory-Based Decoding Architecture for Low Density Parity Check Codes", IEEE Trans. On Circuits and Systems I, vol. 53, No. 5, pp. 1045-1056, May 2006.
Juntan Zhang and Marc Fossorier, "Shuffled Iterative Decoding", IEEE Trans. On Communication, vol. 53, No. 2, pp. 209-213, Feb. 2005.
Radosavljevic, P. De Baynast, A. Cavallaro, Jr, "Optimized Message Passing Schedules for LDPC Decoding", Signals, Systems and Computers, 2005. Conference Record of the Thirty-Ninth Asilomar Conference on pp. 591-595, Oct. 28-Nov. 1, 2005.

* cited by examiner

*Primary Examiner* — James C Kerveros
(74) *Attorney, Agent, or Firm* — Muncy, Geissler, Olds & Lowe, PLLC

(57) ABSTRACT

An operating method and a circuit for low density parity check (LDPC) decoders, in which original bit nodes are incorporated into check nodes for simultaneous operation. The bit node messages are generated according to the difference between the newly generated check messages and the previous check node messages. The bit node messages can be updated immediately, and the decoder throughput can be improved. The required memory of LDPC decoders can be effectively reduced, and the decoding speed can also be enhanced.

14 Claims, 5 Drawing Sheets

OPERATING METHOD AND CIRCUIT FOR LOW DENSITY PARITY CHECK (LDPC) DECODER

BACKGROUND OF THE INVENTION

1. Field of the Invention

The present invention relates to a decoder technique applied to channel coding and, more particularly, to a method applied to low density parity check (LDPC) decoder and the operating circuit thereof.

2. Description of Related Art

The function of error correction code (ECC) is to restore corrupted data that has been destroyed due to bad reliability of transmission medium or interference of external factors as far as possible. Low density parity check (LDPC) code has powerful decoding performance close to the Shannon limit, and is a high-efficiency and high-speed channel coding technique. LDPC code will be widely used when data communication speed reaches several GB/s in the future.

In high-speed communication systems, the decoding procedure of LDPC decoder is described below. First, the decoder is initialized. Check nodes and bit nodes are then updated in turn. After update, whether the overlap number in the data sequence exceeds the predetermined maximum overlap number or the decoded bits satisfy the limit of check matrix. If the answer is yes, the whole procedure is terminated, and the decoded bits are outputted; otherwise, the above steps are repeated till the end.

The above LDPC decoder divides the decoding procedure into two phases: the phase of check nodes 10 and the phase of bit nodes 12, as shown in FIG. 1. Usually, the phase of bit nodes 12 starts to sum up after the phase of check nodes 10 is finished, and the decoder needs to store output messages of these two nodes 10 and 12. Therefore, it is necessary for the decoder to have sufficient corresponding check node processor (CNP) sum message memory 14 and bit node processor (BNP) sum message memory 16 to store output messages generated by the check nodes 10 and the bit nodes 12, respectively. Under this premium, an LDPC code with a longer encoding length will result in increased hardware area and complexity, and will also cause greatly reduced decoding efficiency and raised power consumption.

Accordingly, the present invention aims to propose an operating method applied to LDPC decoder and the circuit thereof to effectively the above problems in the prior art.

SUMMARY OF THE INVENTION

An object of the present invention is to provide an operating method applied to an LDPC decoder and the circuit thereof, in which the operation of updating bit node messages is incorporated into that of check node, and check node input messages are used to generate new bit node messages. When partial of check node messages are generated, all the bit node messages are immediately updated according the newly check node messages. Scheduling the hardware resource and message switching, the decoder can reduce the power consumption with a smaller size memory. At the same times, the LDPC decoder achieves higher decoding throughput.

Another object of the present invention is to provide an operating method applied to LDPC decoder architecture design, which can substantially reduce hardware complexity and power consumption of LDPC decoder, and can also enhance the decoding speed, thereby being able to extensively apply to high-speed wireless communication systems.

To achieve the above objects, the present invention provides an operating method of LDPC decoder, which comprises the steps of: recording an input message of each check node operation; the check node producing an output message according to the input message; producing a new bit node message according to this new check node output messages and the previous check node output message; and using the different value between the new check node output messages and the original check node message to update all the bit node messages To achieve the above objects, the present invention also provides an operation node processor circuit for the LDPC decoder, which comprises a first-stage check node processor and a second-stage check node processor. The first-stage check node processor replaces the role of a prior art bit node processor, and can synchronously work with the second-stage check node processor to perform bit node operation without the need of waiting for the end of check node operation.

BRIEF DESCRIPTION OF THE DRAWINGS

The various objects and advantages of the present invention will be more readily understood from the following detailed description when read in conjunction with the appended drawing, in which.

DETAILED DESCRIPTION OF THE PREFERRED EMBODIMENTS

An LDPC decoder has primarily two phases: the bit node phase and the check node phase, and the decoding messages will be switch between the bit nodes and the check nodes. The decoder updates all the messages for the check nodes first, and then switches the check output messages to the bit nodes. The check node messages for bit node can not be updated immediately, even some part of the check node message has been modified. Large iteration number is required in the traditional decoding method to achieve the system performance. The throughput of the traditional decoder is constraint by message passing that the decoder cannot update all the bit node messages until all the messages are updated in one iteration. Therefore, the present invention proposes a new two-stage check node circuit, which not only performs the operation of the original check circuit, but also simultaneously generates output messages of the original bit nodes.

Figure 1:
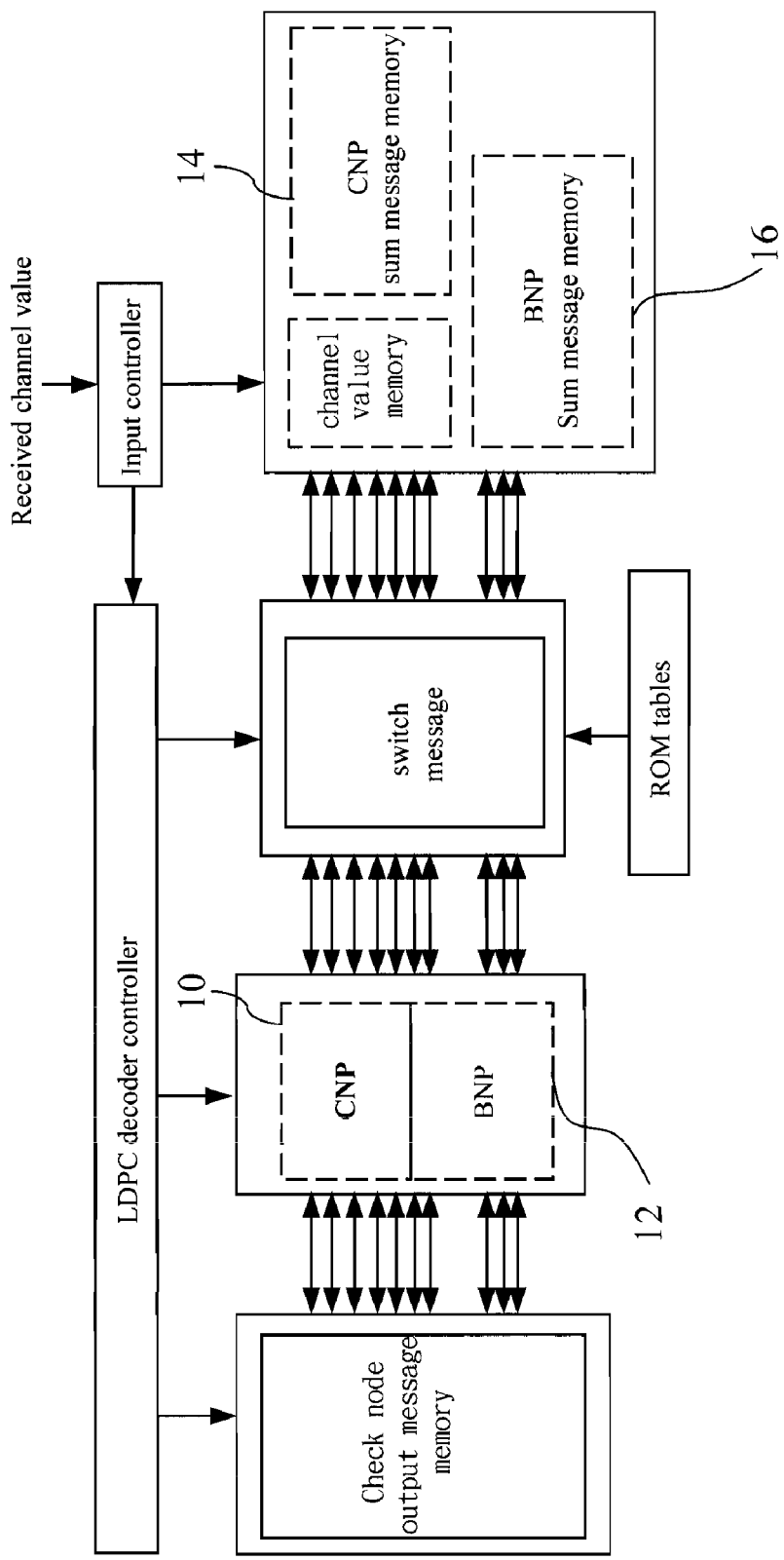
FIG. 1 is a circuit block diagram of a prior art LDPC decoder.
Figure 2:
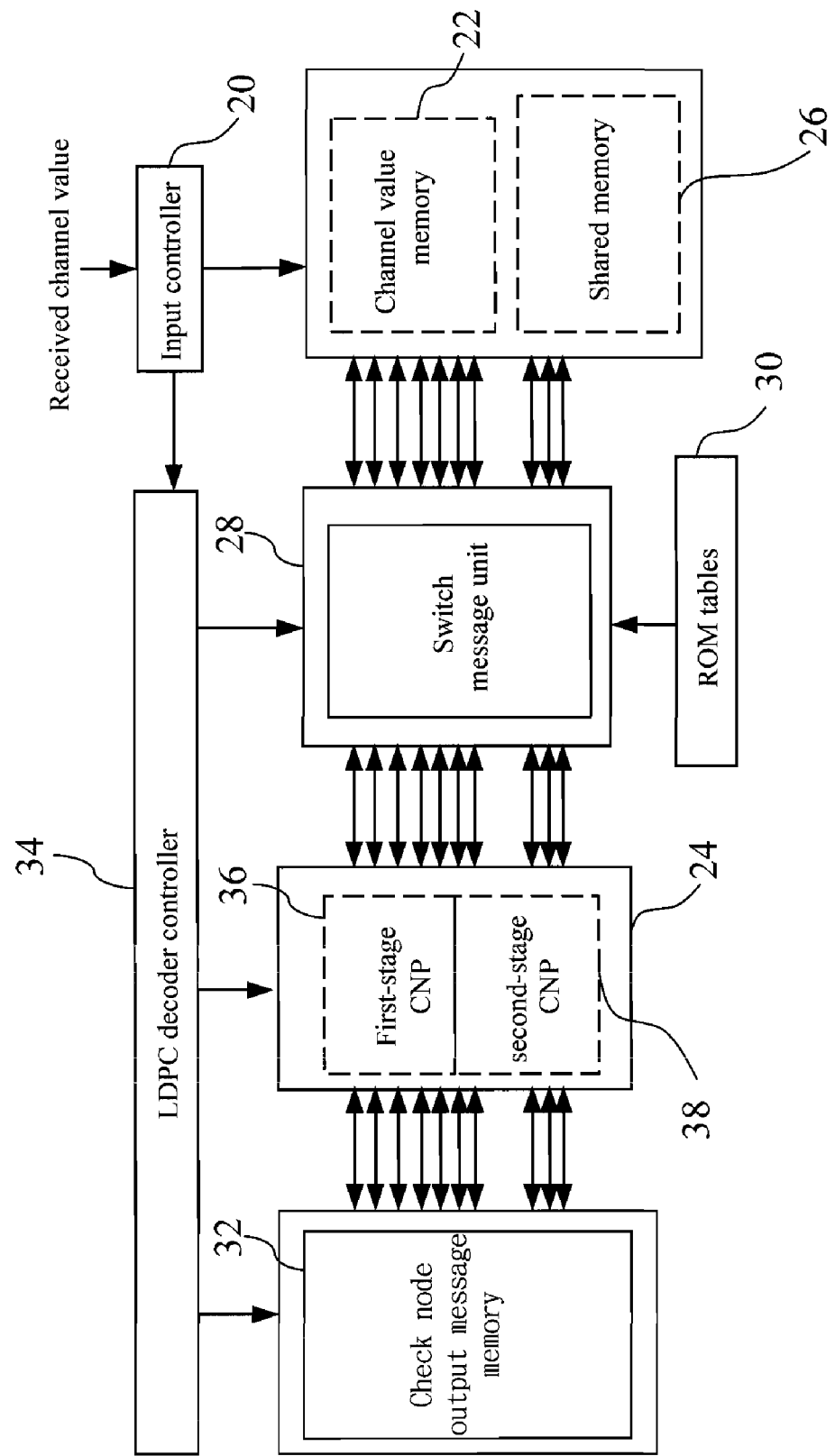
FIG. 2 is a circuit block diagram of an LDPC decoder of the present invention.

FIG. 2 is a circuit block diagram of an LDPC decoder of the present invention. As shown in FIG. 2, the LDPC decoder has an input controller 20, which is used to receive an input channel value and can also store the input channel value into a channel value memory 22. The LDPC decoder has also a check node operator 24, which includes a first-stage check node processor 36 and a second-stage check node processor 38, and stores the sum after operation into a shared memory 26. This check node operator 24 accesses the channel value memory 22 and the shared memory 26 via the same switch message unit 28 or different switch message units 28. Of course, the switch message unit 28 has ROM tables 30 for access comparison. Output messages of the check node operator 24 are stored in a check node output message memory 32. All the above components are controlled by an LDPC decoding controller 34. The first-stage check node processor 36 in the check node operator 24 replaces the role of a prior art bit node processor. Because the first-stage check node processor 36 and the second-stage check node processor 36 jointly use output messages and input messages for operation, only a shared memory 26 is required for message storage.

The present invention proposes a new check node operating method, which includes four steps. First, when performing operation, the input message of each check node operation is recorded by the second-stage check node processor. Next, the first-stage node processor gets new check node output messages, and uses the different values between the new and the previous check node output messages to generate a new bit node message. When part of the check node output messages are generated, the new check node output messages and the original check node input messages are used together to update all bit node messages.

Figure 3:
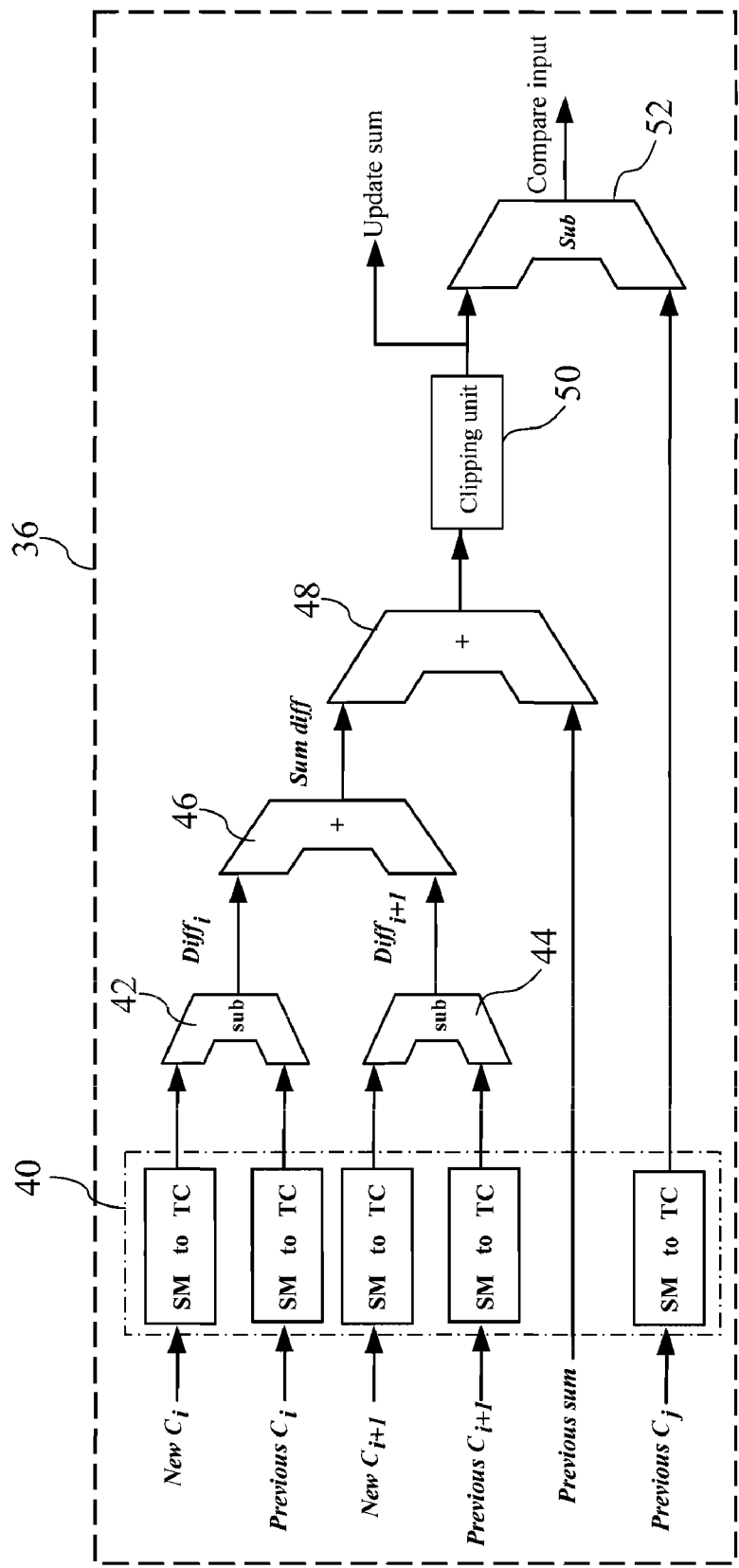
FIG. 3 is a diagram showing the circuit architecture of a first-stage check node processor used in the present invention.
Figure 4:
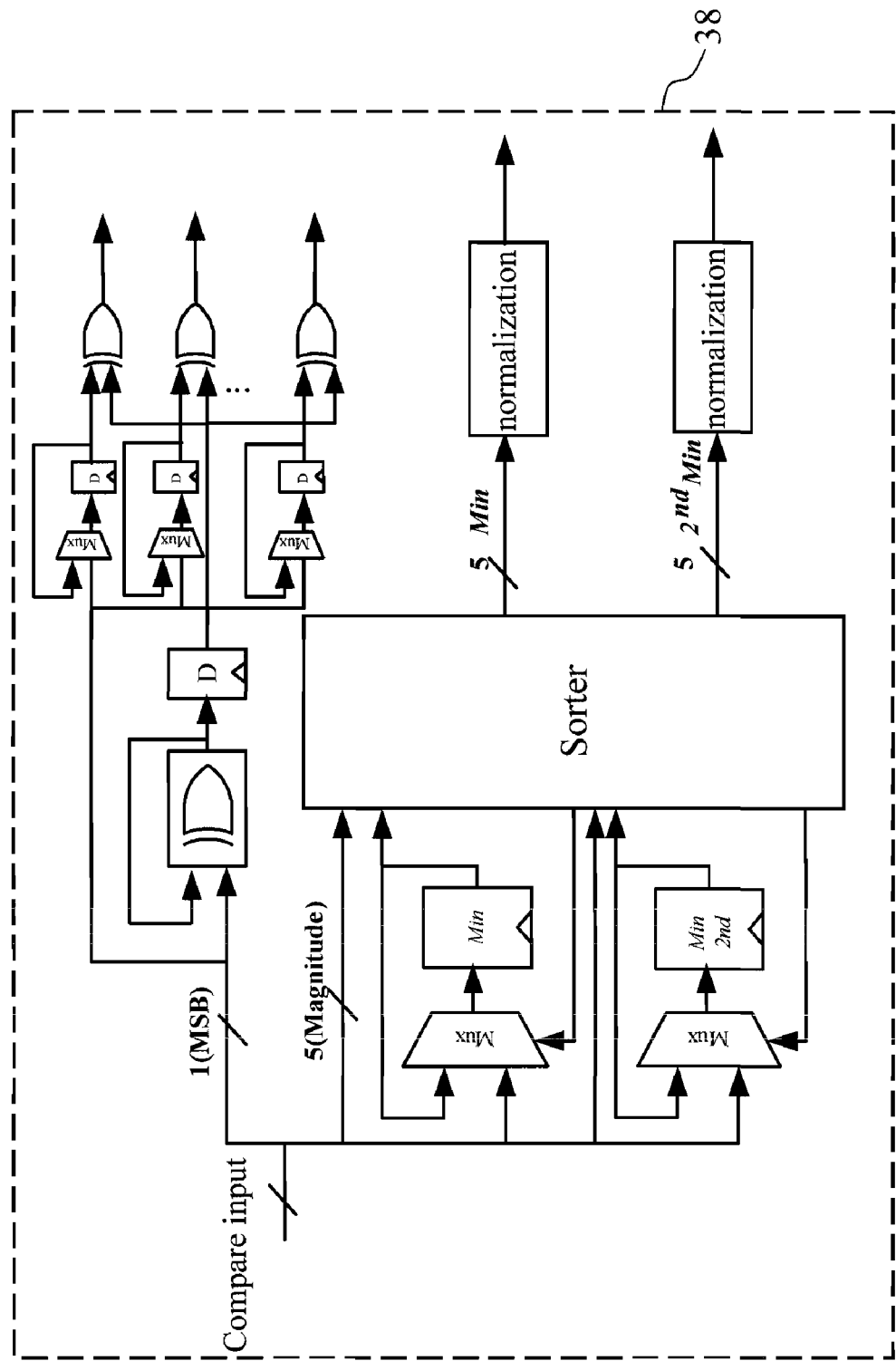
FIG. 4 is a diagram showing the circuit architecture of a second-stage check node processor used in the present invention.

FIG. 3 shows the circuit architecture of the first-stage check node processor 36, and FIG. 4 shows the circuit architecture of the second-stage check node processor 38. As shown in FIG. 3, this embodiment is exemplified with two sets of channel operations. Of course, the degree of parallelism of the check node operation can be adjusted at random. First, new check node input messages (New $C_i$ and New $C_{i+1}$ in the figure) temporarily stored in a high-speed register and the previous check node input messages (Previous $C_i$ and Previous $C_{i+1}$ in the figure) are summed up and converted from sign-magnitude to 2's complements (SM to TC) 40, respectively. Next, a first subtractor 42 is used to subtract the check node input message New $C_i$ and the previous check node input message (Previous $C_i$) of the first way in order to generate a difference $Diff_i$. At the same time, another first subtractor 44 is used to subtract the check node input message New $C_{i+1}$ and the previous check node input message (Previous $C_{i+1}$) of the second way to generate another difference $Diff_{i+1}$. A difference adder 46 is then used to add these two differences $Diff_i$ and $Diff_{i+1}$ to generate difference sum (DiffSum) and send it to an adder 48. This adder 48 sums up this difference sum (DiffSum) and the previous sum to get a new sum. Meanwhile, if this new sum exceeds the original data bit number (e.g., 8 bits shown in the figure), a clipping unit 50 is used to cut down the redundant bits and then update the sum stored in the shared memory, which is the updated bit node message. Finally, a second subtractor 52 is used to subtract this new sum with clipping bit number and the previous check node input message (Previous $C_j$) to generate a compare input, where Previous $C_j$ is a variable. When the degree of parallelism is only 1, e.g., the difference of $C_i$ is taken, then index j>index i. If the degree of parallelism is two, e.g., the difference of $C_i$ and $C_{i+1}$ is taken, then index j>index (i+1). To this point, the compare input generated by the first-stage check node processor 36 will be sent to the second-stage check node processor 38 (shown in FIG. 4), which will work based on the compare input and then output decoded bits. Because the second-stage check node processor is not limited to the circuit architecture shown in FIG. 4, and can be replaced with another existent check node circuit, it won't be further described.

In the above embodiment, the second subtractor 52 is used only when there are check node messages of at least two ways changed. If only one check node is changed, the second subtractor 52 can be saved, and only the first subtractors 42 and 44 can suffice.

Figure 5:
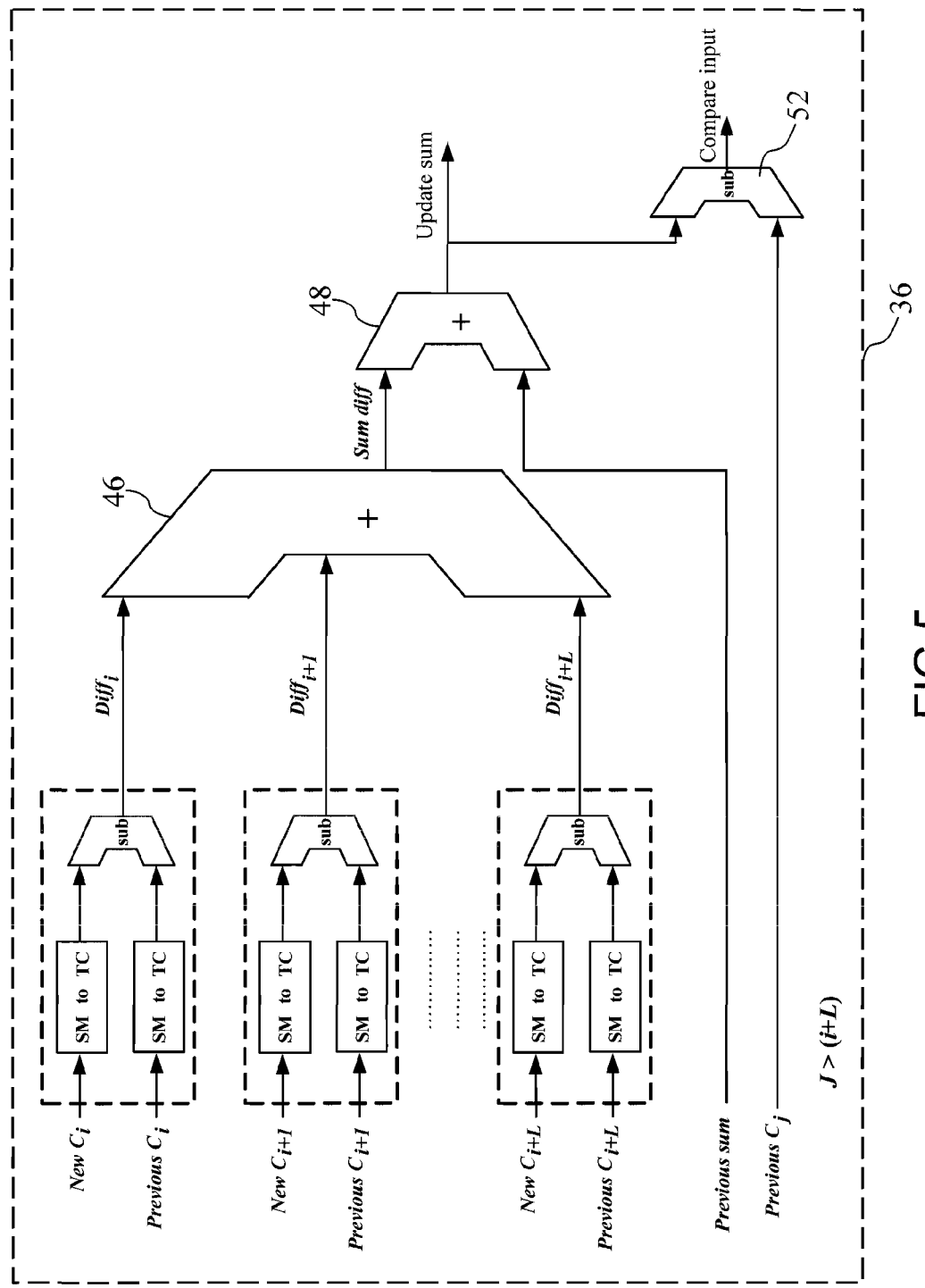
FIG. 5 is a diagram showing the circuit architecture of a first-stage check node processor having L-way check node message of the present invention.

In the above embodiment, the degree of parallelism is 2, and two-way check node are used to illustrate the characteristic of the present invention. Of course, the parallelism of processing circuits for check node message can be increased. As shown in FIG. 5, the first-stage check node processor 36 has L new input messages New $C_i$, New $C_{i+1}$, ..., New $C_{i+L}$ and L previous input messages Previous $C_i$, Previous $C_{i+1}$, ..., Previous $C_{i+L}$, which are summed up and converted from sign-magnitude to 2' complements (SM to TC), respectively. Next, a subtractor is used to generate each difference. Most steps are the same as those in the embodiment of FIG. 3. The different point is the parallelism of processing circuits for bit node message. Of course, the clipping unit 50 can be selectively used in the present invention. In the embodiment of FIG. 5, no clipping unit is used.

To sum up, the present invention only makes use of input messages of original check nodes to generate new bit node messages. Moreover, when the check nodes perform original operation, the new check node output messages and the original check node input messages can be simultaneously used to update the bit node messages. By the messages obtained by check nodes, not only the original check node operation can be performed, but also the new bit node output messages will be generated. The decoding latency for decoder is reduced with a memory-efficient architecture. Furthermore, if the usage bandwidth of memory and the usage efficiency of message switching can be effectively scheduled, the memory access time can be substantially reduced, induces the lower power consumption and increases about 40%~50% decoding throughput. The LDPC decoder can save large amount of memory and power consumption, achieve higher decoding throughput, especially for a large size code word.

Although the present invention has been described with reference to the preferred embodiment thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

We claim:

1. An operating method applied to LDPC decoder comprising the steps of:
    recording an input message of each check node;
    said check node producing an output message according to said input message;
    producing a new bit node message according to said output message and the output message at previous time; and
    when said check node generates a new output message, using said new output message and said input message to update said bit node message generating;
    wherein said new output message is a difference between a newly updated check node message and the previous check node message.

2. The method as claimed in claim 1, wherein said input message, said output message and said bit node message are stored in a shared memory.

3. The method as claimed in claim 1, wherein said check node input message is generated from newly generated bit node output message.

4. An operating circuit applied to LDPC decoder comprising:
 a first-stage check node processor comprising:
  at least a first subtractor for producing a difference between a newly updated check node message and a previous check node message; and
  at least an adder for summing up said difference and a sum of previous check node operation to get a new sum so as to update a bit node message; and
 a second-stage check node processor for operating according to said new sum and outputting decoded bits.

5. The operating circuit as claimed in claim 4, wherein said first-stage check node processor shall further perform operations of two ways by using two first subtractors to generate two differences between the newly updated check node message and the previous check node message of two ways and then by using a difference adder to add said two differences and send a result to said adder for subsequent operation.

6. The operating circuit as claimed in claim 4, wherein after said adder sums up said difference and a sum of the previous check node operation, a clipping unit is used to cut down redundant bits if said new sum exceeds bit number of the original data.

7. The operating circuit as claimed in claim 4, wherein said the newly updated check node message is temporarily stored in a high-speed register.

8. The operating circuit as claimed in claim 4, wherein said sum and said new sum are stored in the same memory.

9. The operating circuit as claimed in claim 4, wherein said newly updated check node message and the previous check node message are summed up and converted from sign-magnitude to 2's complements in advance before being subtracted.

10. The operating circuit as claimed in claim 4, wherein said first-stage check node processor and said second-stage check node processor access a shared memory via at least a switch message unit.

11. The operating circuit as claimed in claim 10, wherein the first-stage check node processor, the second-stage check node processor and the switch message unit are controlled by a decoding controller.

12. The operating circuit as claimed in claim 4, wherein each of said first-stage check node processor and said second-stage check node processor accesses a shared memory via a separate switch message unit.

13. The operating circuit as claimed in claim 12, wherein the first-stage check node processor, the second-stage check node processor and the switch message unit are controlled by a decoding controller.

14. The operating circuit as claimed in claim 4, wherein the first-stage check node processor further comprises a second subtractor, which is used to subtract said new sum and the previous check node input message to generate a compare input, and said second-stage check node processor works based on said compare input and output said decoded bits.

* * * * *